(12) United States Patent
Sakai et al.

(10) Patent No.: US 8,492,895 B2
(45) Date of Patent: Jul. 23, 2013

(54) SEMICONDUCTOR DEVICE WITH GROUNDING CONDUCTOR FILM FORMED ON UPPER SURFACE OF DIELECTRIC FILM FORMED ABOVE INTEGRATED CIRCUIT

(75) Inventors: Hiroyuki Sakai, Kyoto (JP); Takeshi Fukuda, Osaka (JP); Shinji Ujita, Osaka (JP); Yasufumi Kawai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/206,987

(22) Filed: Aug. 10, 2011

(65) Prior Publication Data
US 2011/0291271 A1 Dec. 1, 2011

Related U.S. Application Data

(63) Continuation of application No. PCT/JP2010/001022, filed on Feb. 18, 2010.

(30) Foreign Application Priority Data

Mar. 3, 2009 (JP) .................. 2009-049989

(51) Int. Cl.
*H01L 23/48* (2006.01)
*H01L 21/283* (2006.01)

(52) U.S. Cl.
USPC ......................................... 257/737; 438/622

(58) Field of Classification Search
CPC ..... H01L 21/3205; H01L 23/48; H01L 21/283; H01L 21/822; H01L 23/52; H01L 27/04; H01P 11/00; H01P 3/08

See application file for complete search history.

(56) References Cited

U.S. PATENT DOCUMENTS 5,161,093 A   11/1992   Gorczyca et al.
5,528,209 A   6/1996    Macdonald et al.
(Continued)

FOREIGN PATENT DOCUMENTS

CN    1531087 A    9/2004
CN    1964595 A    5/2007
(Continued)

OTHER PUBLICATIONS

Yanyu Jin et al., "A Wideband Millimeter-Wave Power Amplifier With 20dB Linear Power Gain and +8dBm Maximum Saturated Output Power", IEEE Journal of Solid-State Circuits. vol. 43, No. 7. Jul. 2008. pp. 1553-1562.

(Continued)

*Primary Examiner* — Walter H Swanson
(74) *Attorney, Agent, or Firm* — McDermott Will & Emery LLP

(57) ABSTRACT

A semiconductor chip such as an MMIC is provided. The semiconductor chip has: a Si semiconductor as a substrate; and a low-loss transmission line, and can be easily connected to a circuit board on which the semiconductor chip is to be mounted and can ensure a stable GND potential. The semiconductor chip is a flip-chip semiconductor chip, and includes: a Si substrate; an integrated circuit manufactured on a main surface of the substrate; a dielectric film formed above the integrated circuit; and a conductor film for grounding formed on an upper surface of the dielectric film. The integrated circuit includes a wiring layer including a signal line which transmits signals for the integrated circuit. The signal line, the dielectric film, and the conductor film constitute a microstrip line.

10 Claims, 9 Drawing Sheets

U.S. PATENT DOCUMENTS

| | | |
|---|---|---|
| 7,642,635 B2 | 1/2010 | Kikuchi et al. |
| 2003/0015756 A1* | 1/2003 | Farber et al. .................. 257/336 |
| 2004/0227222 A1 | 11/2004 | Kikuchi et al. |
| 2006/0273463 A1 | 12/2006 | Wakabayashi et al. |
| 2007/0001299 A1 | 1/2007 | Kikuchi et al. |

FOREIGN PATENT DOCUMENTS

| | | |
|---|---|---|
| JP | 01-205549 | 8/1989 |
| JP | 04-233265 | 8/1992 |
| JP | 04-274346 | 9/1992 |
| JP | 05-226500 | 9/1993 |
| JP | 6-037413 | 2/1994 |
| JP | 6-291218 | 10/1994 |
| JP | 09-017959 | 1/1997 |
| JP | 3933601 | 3/2007 |

OTHER PUBLICATIONS

Satoshi Masuda et al., "An Over-110-GHz InP HEMT Flip-Chip Distributed Baseband Amplifier With Inverted Microstrip Line Structure for Optical Transmission System", IEEE Journal of Solid-State Circuits. vol. 38, No. 9, Sep. 2003, pp. 1479-1484.

Chinese Office Action issued in Chinese Patent Application No. 201080010283.8 mailed on Mar. 28, 2013.

* cited by examiner

SEMICONDUCTOR DEVICE WITH GROUNDING CONDUCTOR FILM FORMED ON UPPER SURFACE OF DIELECTRIC FILM FORMED ABOVE INTEGRATED CIRCUIT

CROSS REFERENCE TO RELATED APPLICATION

This is a continuation application of PCT application No. PCT/JP2010/001022 filed on Feb. 18, 2010, designating the United States of America.

BACKGROUND OF THE INVENTION (1) Field of the Invention

The present invention relates to a semiconductor chip and a semiconductor device that includes a mounting circuit board on which the semiconductor chip is flip-chip mounted, and in particular to a high frequency semiconductor integrated circuit such as a monolithic microwave integrated circuit (MMIC) and the like which includes a transmission line.

(2) Description of the Related Art

With the development of communication devices including mobile telephones, a circuit device with which a microwave having a frequency ranging from hundreds of MHz to several GHz and a millimeter wave having a frequency ranging from dozens of GHz to over 100 GHz are handled, has been attracting attention. With the demand for a wide frequency band which allows communication of larger amount or for performing signal processing at higher speed, a desired operating frequency of a circuit is getting higher and higher.

When a frequency becomes higher, a wavelength of a signal becomes close to an actual size of a circuit element. Then, it becomes difficult to handle the circuit element as a lumped parameter element. This necessitates incorporating the size of the circuit into design as a distributed parameter element. In addition, since ununiformity in the shape or mount of the circuit device leads directly to unevenness of frequency characteristics, mounting many components makes it difficult to hold the characteristics of the entire circuit device within standards.

In view of the above circumstances, the technique of a monolithic microwave integrated circuit (MMIC) is used for such a high frequency circuit. With the technique, a passive element such as a transmission line is collectively manufactured on the same semiconductor substrate together with a transistor that is an active element. The reason for this is that it is possible to reduce the number of components by collectively manufacturing, on the substrate, lots of circuit components including the passive element, and to accurately reproduce the characteristics even when the wavelength becomes small, by employing a semiconductor process which enables accurate microfabrication.

A compound semiconductor including GaAs has mainly been used so far, as a semiconductor for MMIC as described above. The primal reason is that it is possible to obtain excellent high frequency characteristics of a transistor resulting from high electron mobility and a low-loss substrate with high insulation properties. However, the substrate of such a compound semiconductor is expensive compared to a generally used Si semiconductor (semiconductor including Si as a main component), and the manufacturing process is still undeveloped in many points compared to a silicon process preceding in mass production. Thus, there is a problem of higher costs in terms of yield ratio as well.

With the recent development in miniaturization techniques, however, the operating frequency of the Si semiconductor has significantly improved. It is reported that the maximum cutoff frequency (ft) and the maximum oscillating frequency (fmax) of a leading-edge microscopic metal-oxide semiconductor (MOS) transistor or a SiGe hetero bipolar transistor has exceeded 100 GHz and has reached 200 GHz. This has led active research and developments to be carried out in various places, with which an MMIC of a microwave band to a millimeter wave band which has been manufactured using an expensive compound semiconductor is to be replaced with a low-cost Si semiconductor.

However, there is a problem in the Si semiconductor in that it is difficult to manufacture a substrate having excellent insulation properties as in a compound semiconductor such as GaAs or the like. More specifically, with the compound semiconductor such as GaAs or the like, for example, it is possible to constitute a microstrip line, as illustrated in FIG. 8, by forming a line 91 on a substrate 90 with the semi-insulating substrate 90 itself being a dielectric body and forming a GND plane (ground conductor) 92 whose bottom surface is metallized, thereby manufacturing a low-loss circuit. However, when the same configuration is applied to the Si substrate, since the Si substrate is conductive in general, a loss in the line significantly increases when an electromagnetic field occurring in the line formed on the Si substrate invades in the substrate.

In order to solve the above-described problem, a multilayer interconnection technique of a silicon integrated circuit is conventionally used for efforts to prevent the electromagnetic field occurring in the line from invading in the Si substrate 93, by constituting a microstrip line including a first layer wire 96 formed on the Si substrate 93 as a ground conductor (GND plane) and an uppermost layer wire 94 as a signal line as illustrated in FIG. 9, for example. This allows the loss of the dielectric body due to conductivity of the Si substrate 93 to be eliminated. However, since an interlayer insulating film 95 used as the dielectric body is substantially thin compared to the semiconductor substrate 93 according to this method, it is necessary to reduce the line width of the signal line in order to obtain the same characteristic impedance as that in the case where the semiconductor substrate 93 is used as the dielectric body. However, since a conductor loss of the signal line increases when the line width is reduced, the loss as the transmission line becomes larger, after all, compared to the compound semiconductor.

Here, it is effective to broaden the line width of the signal line for reducing the conductor loss. However, in order to realize this without decreasing the impedance, it is necessary to thicken the interlayer insulating film that is the dielectric body. As a conventional example of the above-described technique, a technique is proposed by, for example, Patent Literature 1 (Japanese Unexamined Patent Application Publication No. 9-17959), with which a dielectric film such as benzocyclobutene (BCB) or the like which is different from a general interlayer insulating film is deposited for several μm to dozens of μm to constitute the microstrip line using the dielectric film as a dielectric body. This technique is directed to eliminate the loss of the dielectric body by thickening the dielectric film to broaden the line width of the signal line which realizes the same impedance so as to reduce the conductor loss, and by further including a GND plane on the Si substrate to prevent the electromagnetic field from invading in the Si substrate. This implements an MMIC (hereinafter also referred to as "Si-MMIC") which includes a Si semiconductor as a substrate.

However, even with the improvement disclosed by Patent Literature 1, a new problem occurs when a circuit device is to be configured by mounting, in practice, the Si-MMIC on a circuit board.

FIG. 10 is a diagram which schematically shows a sectional structure of a conventional Si-MMIC disclosed by Patent Literature 1 and the like, which is mounted on a circuit board 98 which is used for mounting. A signal line on the MMIC and a signal line on the circuit board are usually connected using a metal wire having a diameter of approximately 25 μm. In addition, since the GND plane 96 on the MMIC is usually insulated from the Si substrate 93, it is necessary to be connected to a GND pattern on the circuit substrate 98 through wire bonding, in the same manner as in the signal line.

Here, as clearly shown by the diagram, since there is a wire 97 with a finite length for the connection between the GND on the MMIC and the GND on the circuit board 98, inductance of the wire 97 cannot be ignored especially in high frequency such as a millimeter wave. The GND plane 96 on the MMIC is in a state floating from the GND via the inductance, and the GND which is supposed to supply a stable potential significantly fluctuates according to a signal, in some cases. This forms a feedback loop in the entire mounting circuit and in some cases causes unnecessary oscillation.

It is to be noted that, since the substrate itself is used as a dielectric body in a conventional MMIC in which a compound semiconductor such as GaAs or the like is used, the GND plane is located on a lower surface of the substrate, and thus it is possible to obtain a stable connection with the circuit substrate. Furthermore, the GND wire on the circuit is also connected to the GND on the bottom surface, usually through via hole, and thus it is possible to minimize a parasitic inductance. With the Si-MMIC as in the conventional technique described above, since the GND is located on the upper surface of the substrate, a large parasitic inductance inevitably occurs in the connection between the GND of the MMIC and the GND of the circuit substrate.

As described above, with the Si-MMIC, the parasitic inductance inevitably occurs in the connection between the GND plane on the upper surface of the MMIC substrate and the circuit substrate, and thus the GND on the MMIC becomes unstable, causing the characteristics to change. Furthermore, there is a problem that it is likely to cause oscillation or the like.

SUMMARY OF THE INVENTION

The present invention has been conceived in view of the above circumstances, and an object of the present invention is to provide a semiconductor chip such as an MMIC which has: a Si semiconductor as a substrate; and a low-loss transmission line, and can be easily connected to a circuit board on which the semiconductor chip is to be mounted and can ensure a stable GND potential, and a semiconductor device including the circuit board on which the semiconductor chip described above is flip-chip mounted.

A first embodiment according to the present invention, which achieves the object described above, is a flip-chip semiconductor chip comprising: a silicon substrate; an integrated circuit manufactured on a main surface of the silicon substrate; a dielectric film formed above the integrated circuit; and a conductor film for grounding formed on an upper surface of the dielectric film, wherein the integrated circuit includes at least one wiring layer including a signal line which transmits a signal for the integrated circuit, and the signal line, the dielectric film, and the conductor film constitute a microstrip line.

With the configuration described above, a GND plane (conductor film) of the microstrip line is formed on an uppermost face, and the GND plane of the microstrip line is reliably connected to the GND, by flipping the semiconductor chip and connecting, via a bump, the GND plane to the GND of the mounting circuit board; that is, by performing flip-chip mounting.

In addition, a second embodiment according to the present invention is a flip-chip semiconductor chip comprising: a silicon substrate; an integrated circuit manufactured on a main surface of the silicon substrate; a first conductor film for grounding formed above the integrated circuit, a dielectric film formed above the first conductor film; at least one wiring layer including a signal line which is formed in the dielectric film and which transmits a signal for the integrated circuit; and a second conductor film for grounding formed on an upper surface of the dielectric film, wherein the signal line, the dielectric film, and the first and second conductor films constitute a strip line.

With the configuration described above, a GND plane (second conductor film) of a strip line is formed on the uppermost face, and the GND plane of the strip line is reliably connected to the GND, by flipping the semiconductor chip and connecting, via a bump, the GND plane to the GND of the mounting circuit board; that is, by performing flip-chip mounting.

It is to be noted that the present invention can be implemented not only as a semiconductor chip but also as a semiconductor device as an assembly in which such a semiconductor chip is connected to a mounting circuit board via a bump.

According to the present invention, a semiconductor chip such as an MMIC which has: a Si semiconductor as a substrate; and a low-loss transmission line, and can be easily connected to a circuit board on which the semiconductor chip is to be mounted and can ensure a stable GND potential, and a semiconductor device including the circuit board on which the semiconductor chip described above is flip-chip mounted are implemented.

Therefore, the MMIC is implemented at lower costs compared with a MMIC including a compound semiconductor, and the practical value is significantly high at the present day in which a variety of small communication devices such as mobile telephones are commonly used.

FURTHER INFORMATION ABOUT TECHNICAL BACKGROUND TO THIS APPLICATION

The disclosure of Japanese Patent Application No. 2009-049989 filed on Mar. 3, 2009 including specification, drawings and claims is incorporated herein by reference in its entirety.

The disclosure of PCT application No. PCT/JP2010/001022 filed on Feb. 18, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

(a) in FIG. 1 and FIG. 11 are respectively a sectional view which shows a semiconductor chip according to Embodiment 1 of the present invention, and (b) in FIG. 1 and FIG. 11 are respectively a sectional view which shows a semiconductor device according to Embodiment 1 of the present invention.

Figure 5:
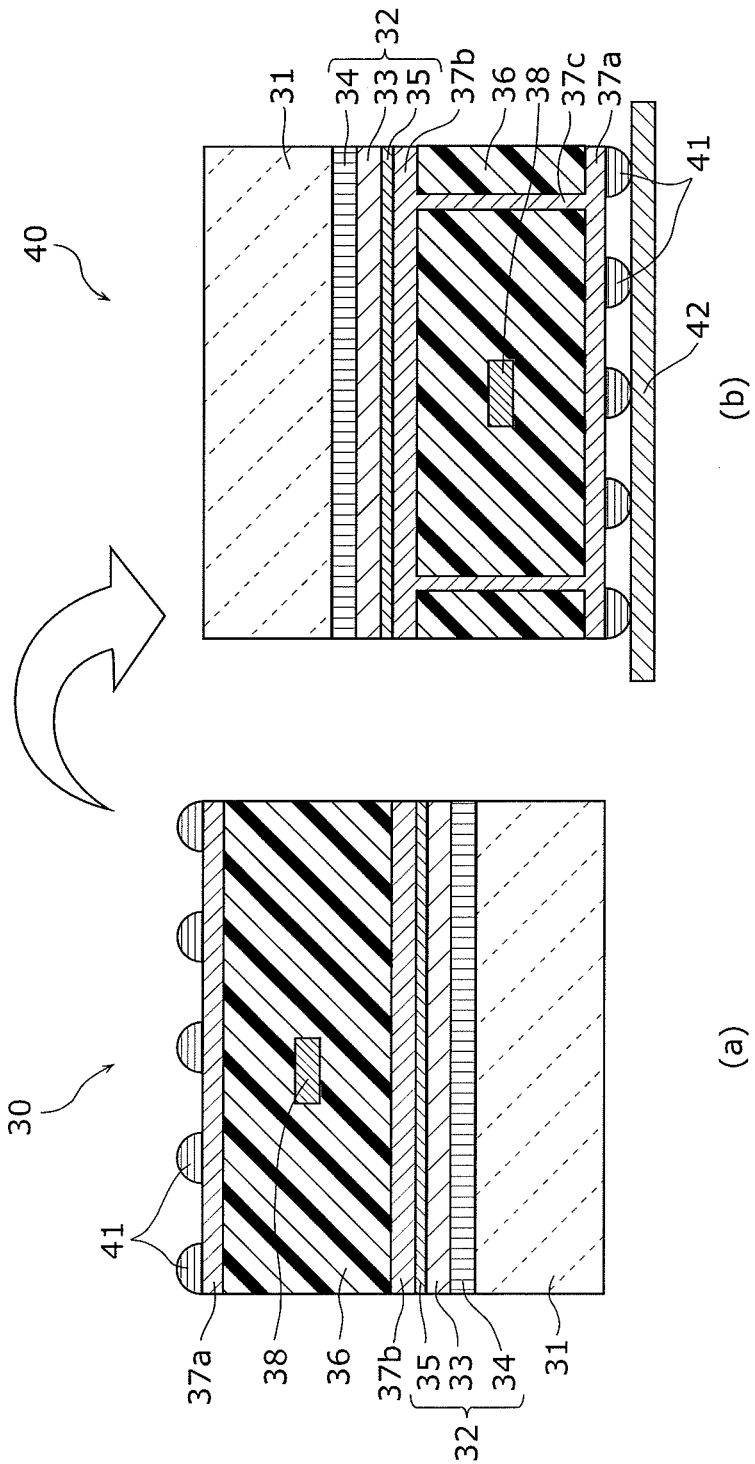
Figure 6:
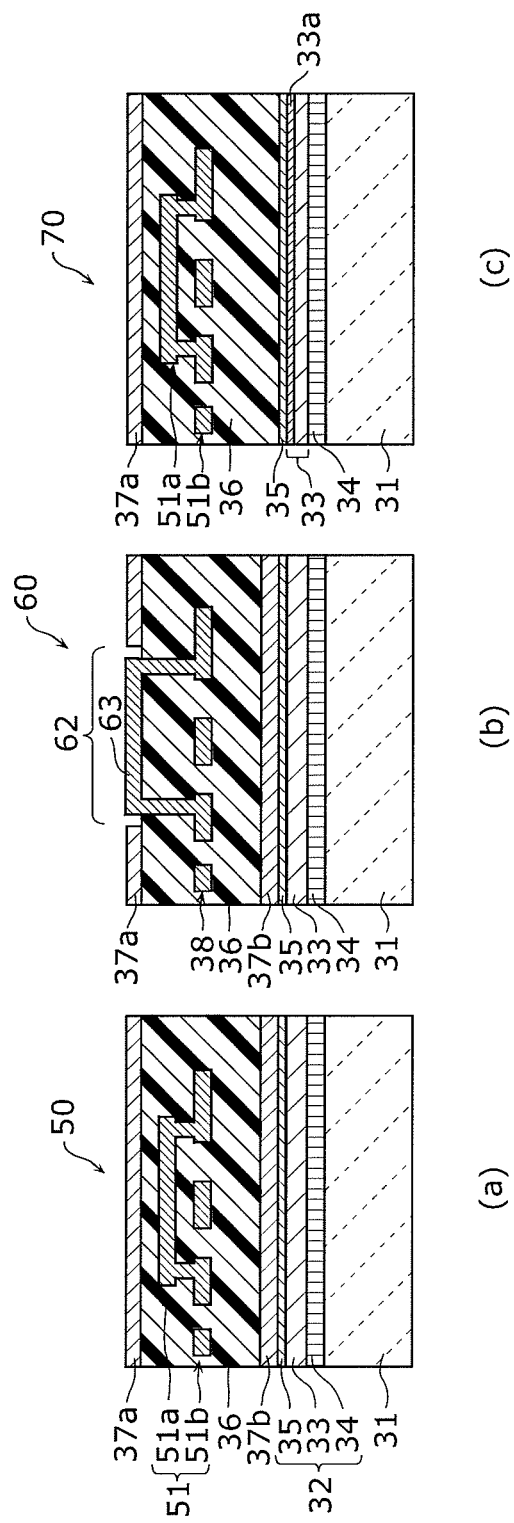
Figure 7:
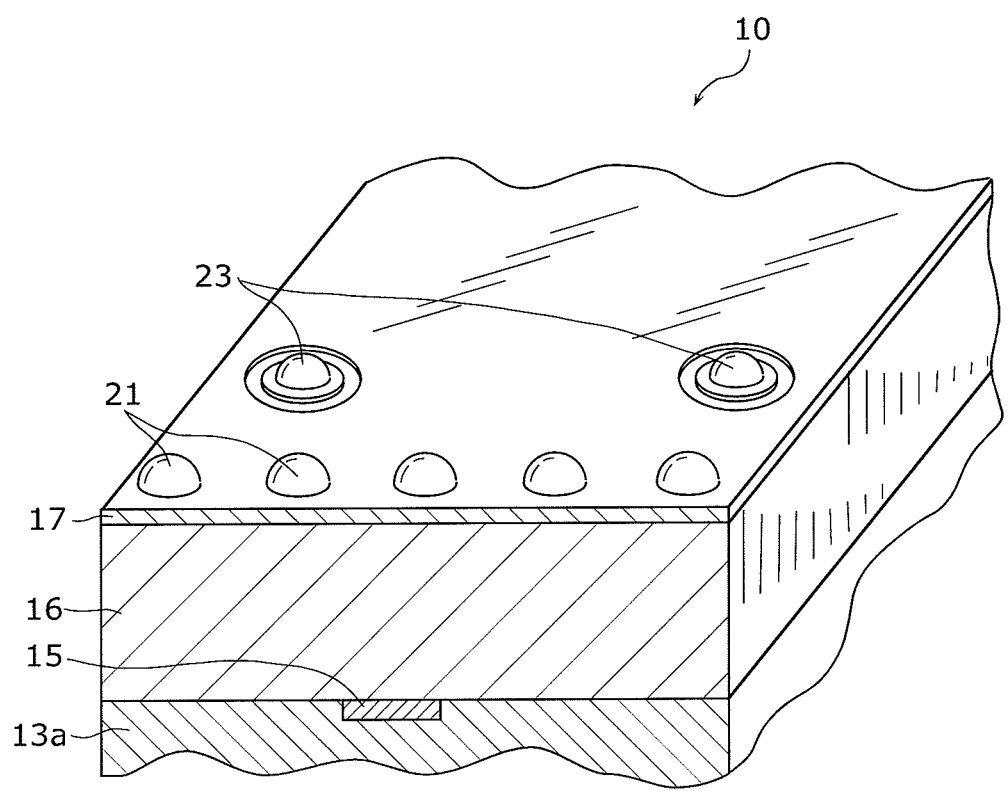
Figure 8:
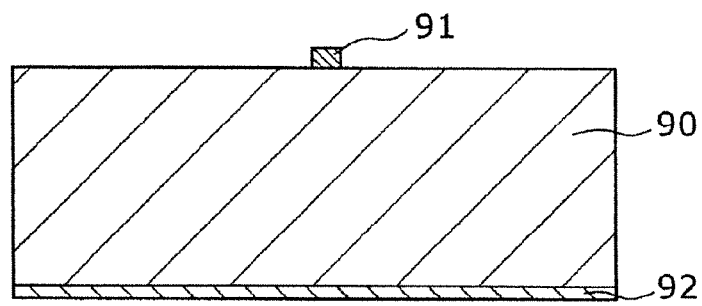
Figure 9:
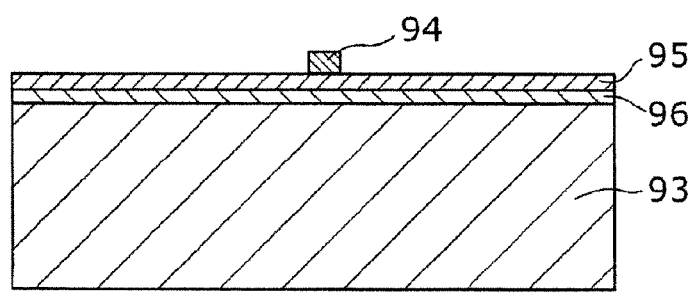
Figure 10:
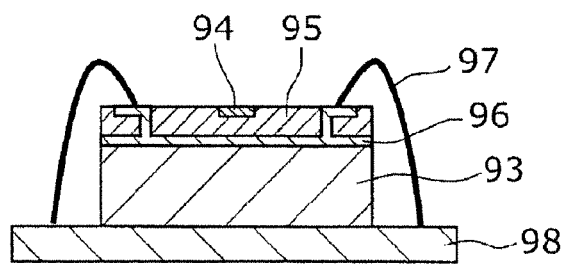

(a) in FIG. 5 is a sectional view which shows a semiconductor chip according to Embodiment 2 of the present invention, and (b) in FIG. 5 is a sectional view which shows a semiconductor device according to Embodiment 2 of the present invention;

FIG. 6 is a sectional view which shows a semiconductor chip according to a modification of Embodiment 2;

FIG. 7 is a perspective view which shows an upper surface of the semiconductor chip according to an embodiment of the present invention;

FIG. 8 is a diagram which shows a microstrip line including a conventional compound semiconductor as a substrate;

FIG. 9 is a diagram which shows a microstrip line including conventional Si as a substrate; and FIG. 10 is a diagram which shows a state in which a conventional Si-MMIC is mounted on a circuit board.

DESCRIPTION OF THE PREFERRED EMBODIMENTS

Embodiments according to the present invention will be described in detail below with reference to the drawings.

Embodiment 1

First, a semiconductor chip and a semiconductor device according to Embodiment 1 will be described.

Figure 1:
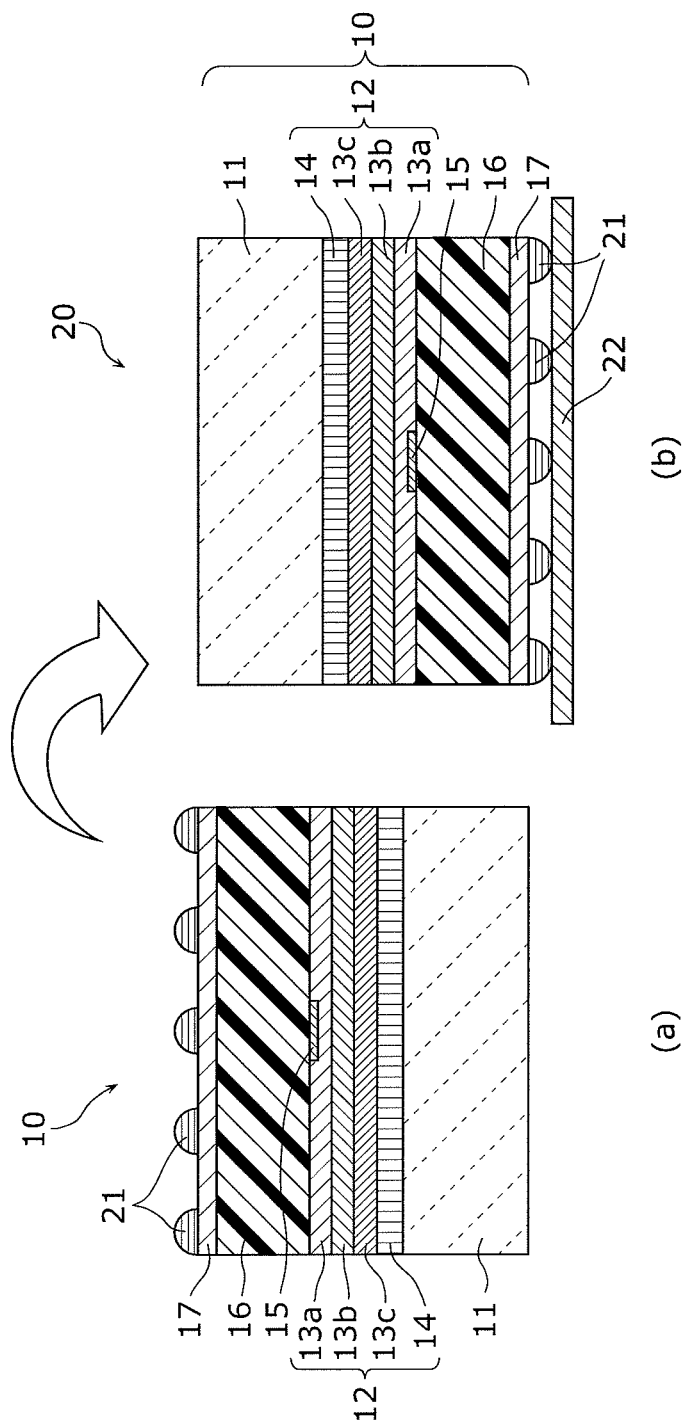

(a) in FIG. 1 is a sectional view which shows a semiconductor chip 10 according to Embodiment 1 of the present invention. (b) in FIG. 1 is a diagram which shows the semiconductor chip 10 that is flip-chip mounted on a mounting circuit board 22; that is, a sectional view which shows a semiconductor device 20 according to Embodiment 1 of the present invention. It is to be noted that a bump 21 which is used for the flip-chip mounting is also illustrated for convenience in addition to the semiconductor chip 10 in (a) in FIG. 1.

The semiconductor chip 10 shown in (a) in FIG. 1 is a Si-MMIC that is to be flip-chip mounted on the mounting circuit board 22 via the bump 21, in a state flipped upside down as shown in (b) in FIG. 1. The semiconductor chip 10 includes: a Si substrate 11; an integrated circuit 12 manufactured on a main surface of the Si substrate 11; a dielectric film 16 formed above the integrated circuit 12; and a conductor film 17 for grounding, which is formed on an upper surface of the dielectric film 16. Here, the integrated circuit 12 includes: a circuit layer 14; and wiring layers 13a to 13c including a signal line 15 which transmits signals from the integrated circuit, and the signal line 15, the dielectric film 16, and the conductor film 17 constitute a so-called microstrip line. It is to be noted that, in (a) in FIG. 1 and (b) in FIG. 1, detailed illustration of structural elements is omitted, such as a GND wire and a passivation film in the wiring layer 13a, a post (contact) that penetrates the dielectric film 16, and the like which are shown in the diagrams for explaining a manufacturing method which will be described later.

The Si substrate 11 is a substrate including a Si semiconductor, and preferably a Si substrate having a resistivity of 10 Ωcm or larger. More preferably, the Si substrate 11 is a Si substrate having the resistivity of 100 Ωcm or larger.

The integrated circuit 12 includes: the circuit layer 14 including a circuit element such as a transistor or the like, and formed on an upper surface of the Si substrate 11; and the wiring layers 13a to 13c including the signal line 15 such as Al, Cu, or the like, which transmits signals from the circuit layer 14. The wiring layers 13a to 13c form a multilayer wiring layer in which a signal line is formed on each of the multiple layers via an insulating film such as $SiO_2$, SiN, or the like.

Figure 11:
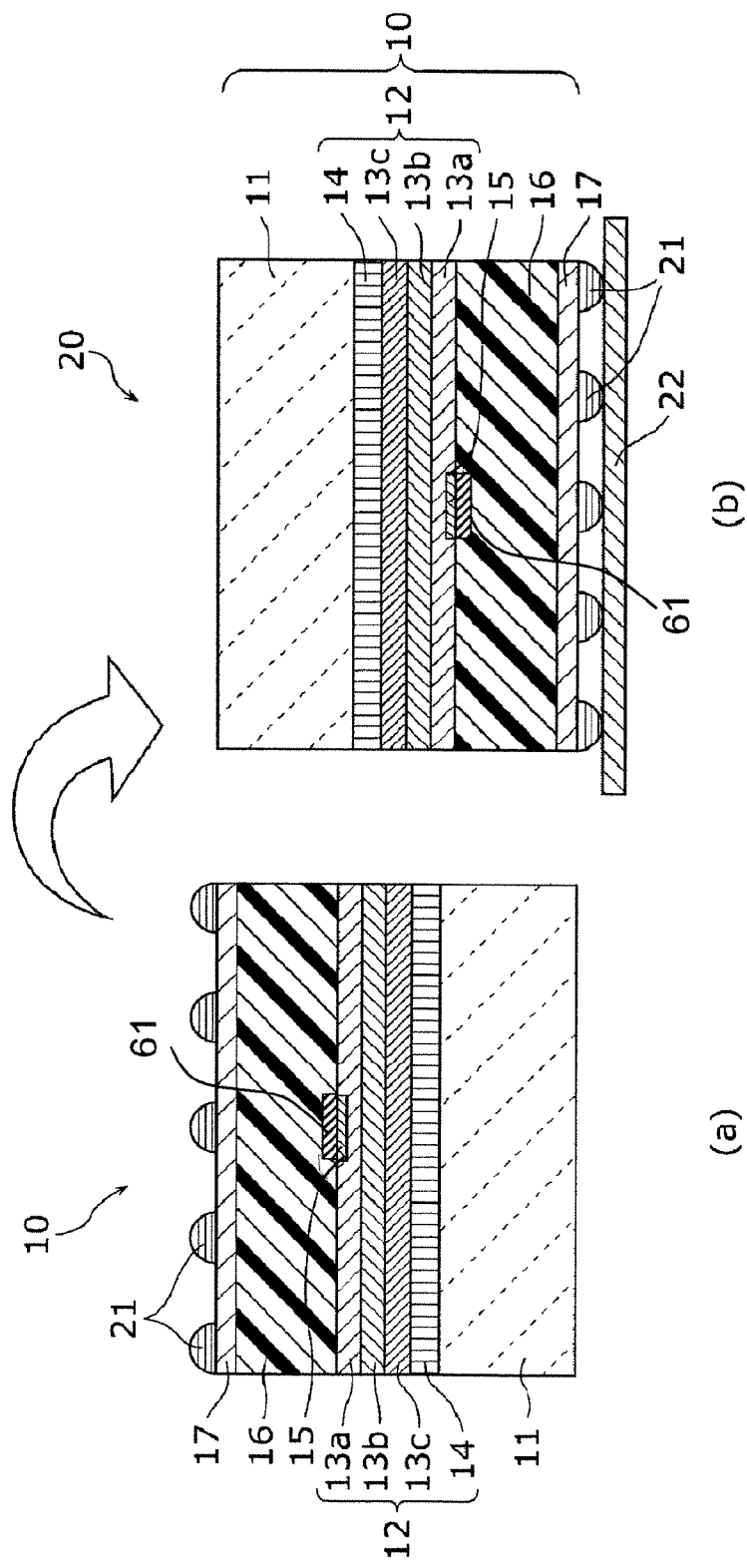

It is to be noted that the diagram shows the circuit layer 14 as a single circuit layer in the integrated circuit 12; however, the circuit layer is not limited to a single circuit layer in the present invention, and the circuit layer may be multilayer according to the present invention. In addition, only the signal line 15 in the wiring layer 13a that is the uppermost layer among the wiring layers 13a to 13c is illustrated in the diagram, and illustration of signal lines in the other wiring layers 13b and 13c is omitted. In each of the wiring layers 13a to 13c, not only an independent signal line but also a signal line that is connected to a signal line in the upper or lower wiring layer is provided. In addition, as shown in FIG. 11, in the wiring layer 13a that is the uppermost layer, a conductor film 61 for an electrode pad connected to an element of the circuit layer 14 may be included. The signal lines and the conductor film for the electrode pad correspond to the transmission line that constitutes the microstrip line.

The dielectric film 16 corresponds to a dielectric body that constitutes the microstrip line, is a polymeric film which has less dielectric loss and which can be formed into a thick film, and preferably is: a film that includes, for example, BCB, polyimide, polytetrafluoroethylene, or polyphenylene oxide; a nanocomposite film in which particles made of a first material are dispersed into a second material; or the like. In addition, it is preferable, as the nanocomposite film, that a diameter is between 1 nm and 200 nm, inclusive, and that the material is ceramics that includes: strontium titanate; barium strontium titanate; hafnium oxide; hafnium aluminate; or lead zirconate titanate.

The conductor film 17 is a film which is formed of Al, Cu, Au, or the like, or an alloy or the like including the same, and which corresponds to the GND plane that constitutes the microstrip line. The conductor film 17 is connected to a GND pattern on the mounting circuit board 22 via the bump 21.

The method of manufacturing the semiconductor chip 10 described above includes two main processes. To be more specific, the method includes: a usual silicon chip manufacturing process (so-called Si process) in which the integrated circuit 12 is formed on the Si substrate 11; and a rewiring process (so-called post process) in which the dielectric film 16 and the conductor film 17 are formed after the Si process. It is to be noted that the wiring layers 13a to 13c are referred also to as inner wiring layers because the wiring layers 13a to 13c are formed in the Si process.

The semiconductor chip 10 having the above-described configuration according to the present embodiment has a feature in that the signal line 15, the dielectric film 16, and the conductor film 17 constitute the microstrip line. Here, "to constitute the microstrip line" means to have a configuration in which a dielectric body is interposed between the signal line and the conductor film, and more specifically means that a parameter such as the thickness and width of the signal line 15, dielectric constant and the thickness of the dielectric film 16, and the like, which determines a characteristic impedance of the microstrip line, is determined such that the characteristic impedance of the microstrip line substantially matches a value required for the transmission line.

In the semiconductor chip 10 according to the present embodiment, the vertical positioning is switched between the signal line 15 and the conductor film 17 compared to the microstrip line on a conventional MMIC. It is therefore possible, by flipping the semiconductor chip 10 to be flip-chip mounted on the mounting circuit board 22, to connect the conductor film 17 that is located on the uppermost face of the semiconductor chip 10 directly to the GND of the mounting circuit board 22 via the small bump 21. This minimizes the inductance in a portion (the bump 21, here) on which the conductor film 17 is connected to the GND and causes the GND plane (the conductor film 17, here) that constitutes the microstrip line to be reliably grounded, thereby avoiding unnecessary oscillation.

Here, it is desirable that the signal line that constitutes the microstrip line is as thick as possible in order to reduce the conductor loss. In view of the above, a wiring layer (the wiring layer 13b, for example) located below a wire in the uppermost layer (wire in the wiring layer 13a, here) may be stacked and used in addition to the wire in the uppermost layer, as the signal line that constitutes the microstrip line. In addition, a conductor film for the pad such as Al, which is used for the pad portion may be stacked and used.

The following describes the purpose of defining that the substrate resistance (resistivity) of the Si substrate 11 included in the semiconductor chip 10 according to the present embodiment is preferably 10 Ωcm or larger and more preferably 100 Ωcm or larger.

The characteristic impedance of the microstrip line is determined mainly by the width W of the signal line 15, the thickness h of the dielectric film 16, and the dielectric constant $\in$ of the dielectric film 16, as described above. The film thickness h of the dielectric film 16 needs to be increased for reducing the conductor loss, by enlarging the signal line width W while maintaining the same characteristic impedance, and thus it is preferable for the dielectric film 16 to be thicker. However, unlike the microstrip line on a conventional Si-MMIC, the Si substrate 11 is not electrically shielded in the present embodiment. Accordingly, many of electric flux lines from the signal line 15 are terminated in the GND plane (conductor film 17); however, part of the electric flux lines invade in the Si substrate 11 located in the opposite direction.

Figure 2:
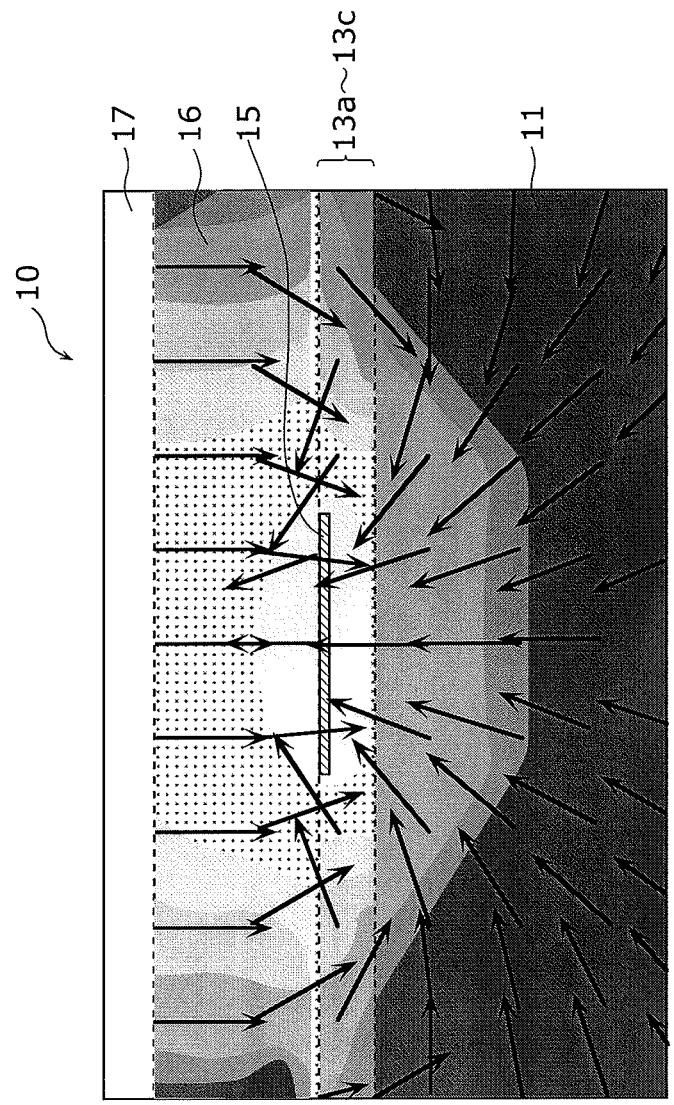
FIG. 2 is a diagram which shows an intensity of an electric field around a microstrip line of the semiconductor chip described above.

FIG. 2 is a diagram which shows a result of calculating, using an electromagnetic field simulator, the intensity of the electric field around the microstrip line in the configuration of the present embodiment. It is to be noted that, for this simulation, it is assumed that the integrated circuit 12 has a configuration in which the inner wiring layers 13a to 13c which are insulation layers are formed on the Si substrate 11 and the signal line 15 is formed in the uppermost layer of the inner wiring layers. In addition, the intensity of the electric field is higher in the brighter region in the diagram. More specifically, the diagram shows that the intensity of the electric field is high near the signal line 15 and the intensity of the electric field is low in the Si substrate 11 which is far from the signal line 15.

As shown in the electric field of FIG. 2, as a result of making the thickness of the dielectric film 16 larger than the total thickness of the interlayer insulating films of the inner wiring layers 13a to 13c (the thickness of the insulation layer shown in the integrated circuit 12, here), part of the electric filed invades in the Si substrate 11 that is conductive, partly because the distance from the signal line 15 to the Si substrate 11 is closer than the distance from the signal line 15 to the GND plane (conductor film 17). Therefore, increasing the thickness h of the dielectric film 16 more than is necessary increases the electric field invading in the Si substrate 11, and thus there is a possibility of causing a higher loss.

It is effective to increase the resistance of the Si substrate 11 in order to reduce the above-described effect.

Figure 3:
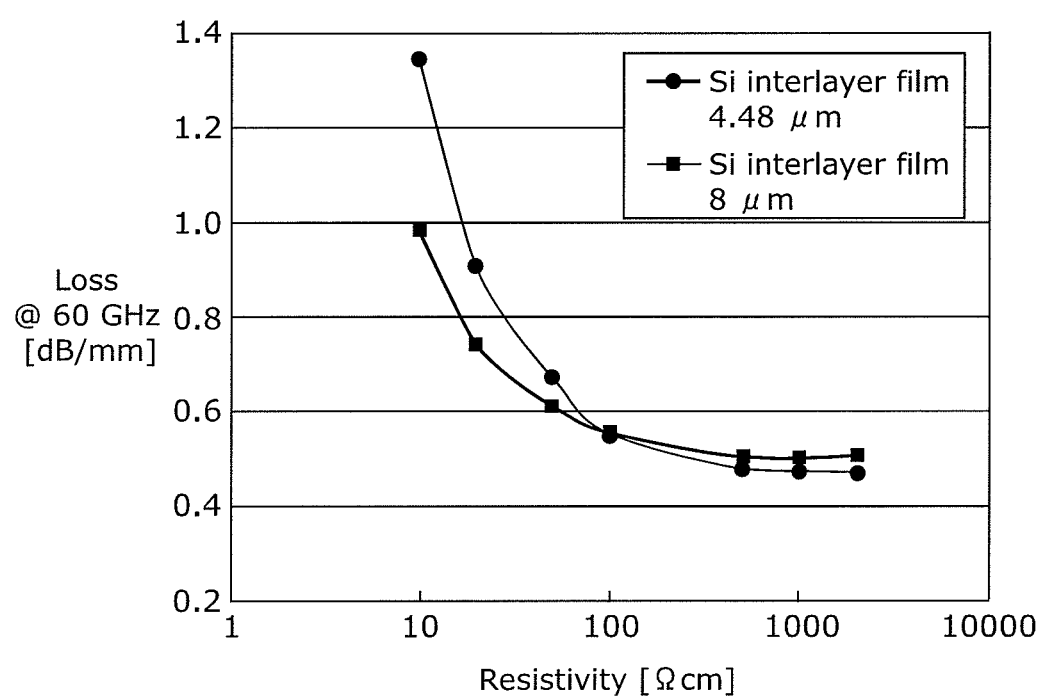
FIG. 3 is a diagram which shows a line loss of the microstrip line of the semiconductor chip when a substrate resistance is changed.

FIG. 3 shows a result of calculating, using the electromagnetic field simulator, a line loss of the microstrip line per 1 mm at 60 GHz when changing the substrate resistance of the Si substrate 11 with the same configuration as the configuration of the semiconductor chip 10 according to the present embodiment. Here, the horizontal axis represents the substrate resistance (resistivity (Ωcm)) of the Si substrate 11, the vertical axis represents the line loss (dB/mm) of the microstrip line per 1 mm at 60 GHz, the plot with circles is a curve which shows a relationship between the substrate resistance and the line loss when the interlayer insulating film of the inner wiring layer is 4.48 μm, and the plot with squares is a curve which shows a relationship between the substrate resistance and the line loss when the interlayer insulating film of the inner wiring layer is 8 μm.

As shown in FIG. 3, the line loss of the microstrip line is significantly reduced as the substrate resistance of the Si substrate 11 increases, and the tendency is more noticeable as the interlayer insulating film of the inner wiring layer is thinner. The line loss is reduce by half just by increasing the substrate resistance from 10 Ωcm to 50 Ωcm, and starts to be virtually saturated when exceeding 100 Ωcm. It is to be noted that, as disclosed in Non Patent Literature 1 (Yanyu Jin, Mihai A. T. Sanduleanu, AND John R. Long, "A Wideband Millimeter—Wave Power Amplifier With 20 dB Linear Power Gain AND +8 dBm Maximum Saturated Output Power" IEEE JOURNAL OF SOLID-STATE CIRCUITS, VOL. 43, NO. 7, JULY 2008, pp. 1553-1562), the loss of the transmission line of the conventional MMIC in which only the inner wiring is used is approximately 1 dB/mm. With the semiconductor chip 10 according to the present embodiment, the line loss becomes lower than the conventional MMIC according to the thickness of the interlayer insulating film of the inner wiring layer (for example, 8 μm or larger), by setting the substrate resistance as 10 Ωcm or larger, and furthermore, the line loss is minimized and virtually saturated by setting the substrate resistance as 100 Ωcm or larger. In view of the above, the substrate resistance (resistivity) of the Si substrate 11 included in the semiconductor chip 10 according to the present embodiment is set preferably as 10 Ωcm or larger and more preferably as 100 Ωcm or larger.

The following describes in more detail a material of the dielectric film 16 included in the semiconductor chip 10 according to the present embodiment.

The degree of invasion of the electromagnetic field into the Si substrate 11 changes depending also on the dielectric constant of the dielectric film 16 and the inner wiring layer, in addition to the relationship between the thickness of the dielectric film 16 and the thickness of the inner wiring layer. Since the electric field generally concentrates in a place with a higher dielectric constant, it is desirable to increase the dielectric constant of the dielectric film 16 in order to suppress the invasion of electric field into the Si substrate 11. To do so, a nanocomposite film, in which particles made of a first material are dispersed into a second material, is used as the dielectric film 16, thereby implementing the dielectric film 16 with a high dielectric constant. Here, the "nanocomposite film" is a film including a material in which a nanoscale particle including the first material with a large dielectric constant is dispersed into the second material.

For example, a nanocomposite film obtained by kneading, into BCB, a high dielectric body material which is made into a nanoscale particle and dispersing the BCB, has a significantly higher dielectric constant compared to the BCB. As the high dielectric body material, the ceramics is preferable, such as strontium titanate (STO), barium strontium titanate (BST), barium titanate (BTO), hafnium oxide ($HfO_2$), hafnium aluminate ($HfAlO_2$), lead zirconate titanate (PZT), and so on. Here, it is only necessary for the diameter of the nanoscale particle to be kneaded into the second material and dispersed, and the smaller the diameter, the more preferable. To be more specific, 1 μm or smaller is preferable, and 200 nm or smaller is more preferable. In particular, an excellent characteristic is obtained for a nanocomposite film in which particles each having a diameter of between 1 nm and 200 nm, inclusive, are dispersed.

As described above, using the nanocomposite film as the dielectric film 16 allows not only increasing the dielectric constant but also arbitrarily selecting the dielectric constant of the dielectric film 16, and thus it is possible to arbitrarily design the thickness of the dielectric film 16 for obtaining a predetermined characteristic impedance.

It is to be noted that, as a method of manufacturing such a nanocomposite film, when BCB is used as a base (second material), for example, the spin coat method is used to easily carry out the manufacturing in the same manner as in the BCB film.

In addition, the dielectric film 16 is not limited to a single nanocomposite film, and the BCB film and the nanocomposite film may be stacked or plural nanocomposite films each having different dielectric constant may be stacked. Such stacking increases a degree of freedom for the dielectric constant of the dielectric film 16 as a whole, thereby increasing a degree of freedom for the thickness of the dielectric film 16 when designing a predetermined characteristic impedance.

Figure 4:
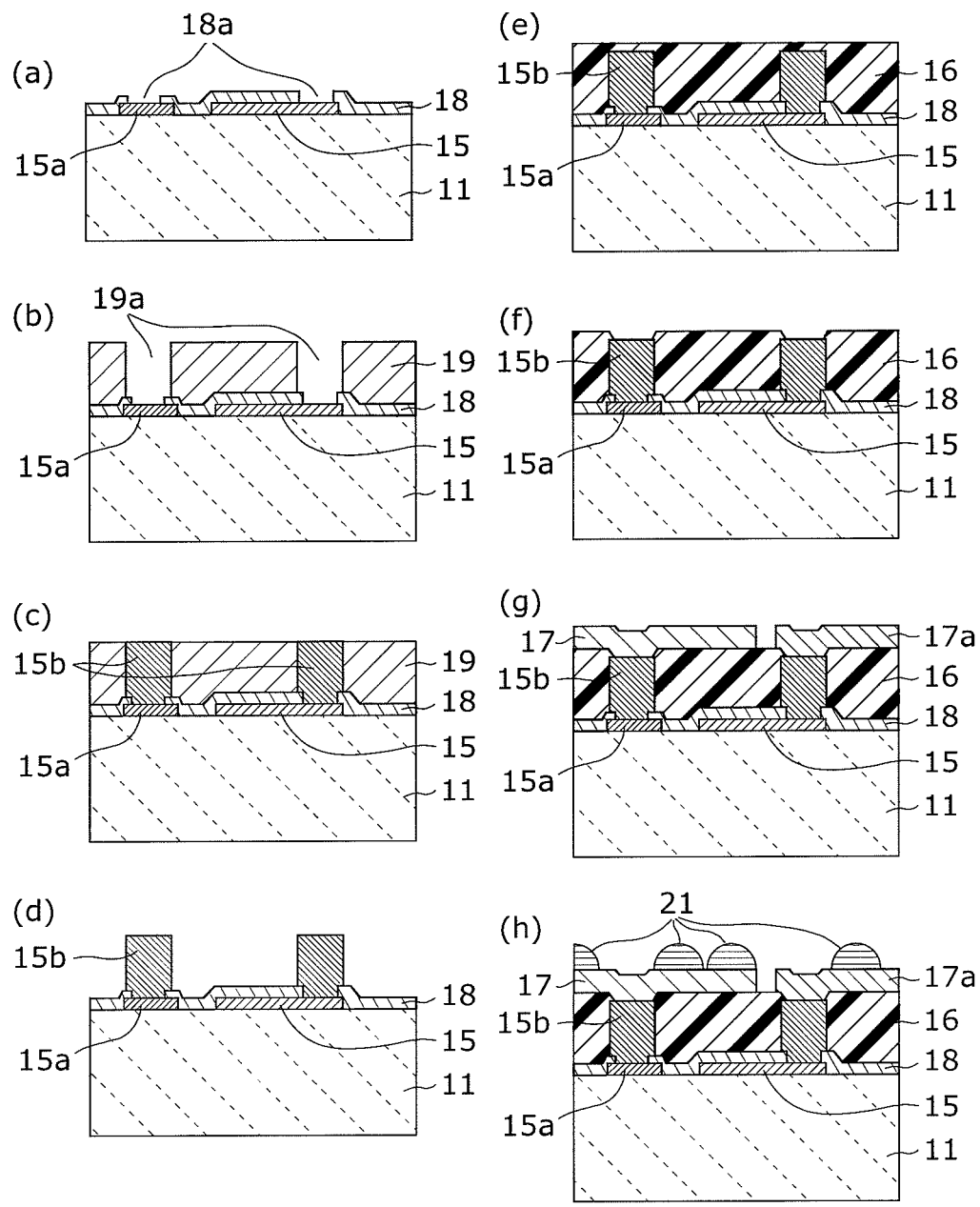
FIG. 4 is a diagram which shows a manufacturing method of the semiconductor chip.

The following describes, with reference to (a) to (h) in FIG. 4, a manufacturing method of the semiconductor chip 10 according to the present embodiment. (a) in FIG. 4 shows a sectional structure of part of a wafer of which a Si process (diffusion process) is completed. In this example, only the signal line 15, the GND wire 15a, and the passivation film 18 which are included in the uppermost wiring layer 13a are illustrated, and illustration of other portions such as inner wiring layers (wiring layer 13b, wiring layer 13c) or the circuit layer 14 such as the transistor is omitted. In the passivation film 18, an opening 18a is provided in some parts for connecting to wiring of the rewiring process (post process). Since a relatively thick interlayer film is formed in the rewiring, attention is required in forming a contact that connects an upper layer and a lower layer. In the example of the present manufacturing method, a Cu post is formed in advance.

First, as illustrated by (b) in FIG. 4, a resist 19 having a thickness of 10 μm to 15 μm is coated, and then openings 19a are formed through a photolithography process. Next, posts 15b composed of Cu are formed in the openings 19a in the resist 19, using electroless plating, electrolytic plating with which a metal film is formed in advance, or the like ((c) in FIG. 4).

The resist 19 is removed ((d) in FIG. 4) and then a BCB 16 that is the dielectric film 16 is spun onto the wafer overall ((e) in FIG. 4). It is possible to planarize the surface with the post 15b being embedded, by appropriately selecting a coating condition and a prebaking condition. Next, part of the BCB 16 is opened through dry etching or the like in order to expose an upper portion of the posts 15b ((f) in FIG. 4), and a film of Cu of approximately 5 μm is formed through plating or the like, thereby forming a wire of an upper layer that is the GND plane 17 connected to the GND wire 15a ((g) in FIG. 4). It is to be noted that, part of the GND plane 17 may be removed through etching or the like, or plating may be performed on the GND plane 17 after patterning is performed using a resist in advance, to form a lead 17a for a signal line connected to the signal line 15. Bumps 21 for connecting the substrate are formed on the uppermost layer wire as necessary ((h) in FIG. 4).

It is to be noted that, the BCB 16 is coated after the posts 15b composed of Cu are formed in advance in the example of the manufacturing method; however, contacts 15b may be formed by forming a thick film using the BCB 16 first, opening part of the film, and filling the opening with a metal. In this case, it is possible to easily form an opening using a photosensitive BCB 16.

In addition, the GND plane 17 is formed after the posts 15b and then the process is completed in the example of the manufacturing method; however, it is possible to form a multilayer wiring by repeating this process. Forming the multilayer wiring can embody the configuration shown in Embodiment 2 and the modification example described later, by, for example, forming the GND plane with the uppermost layer wire 15 in the Si process (inner wiring), forming a signal of a strip line with the first wire in the post process, forming a bridge wire for connecting the first wires with the second wire in the post process, and forming the GND plane with the third wire.

In addition, Cu is selected as the material for the wire 15 and the post 15b in the example of the manufacturing method; however, the material is not limited to Cu, and the dielectric film 16 is not limited to BCB.

As described above, a GND plane (conductor film) of a microstrip line is formed on the uppermost face in the semiconductor chip according to the present embodiment, and the GND plane of the microstrip line is reliably connected to the GND, by flipping the semiconductor chip and connecting, via a bump, the GND plane to the GND of the mounting circuit board; that is, by performing flip-chip mounting. Accordingly, a semiconductor chip such as an MMIC which has: a Si semiconductor as a substrate; and a low-loss transmission line, and can be easily connected to a circuit board on which the semiconductor chip is to be mounted and can ensure a stable GND potential, and a semiconductor device on which the semiconductor chip described above is flip-chip mounted on the circuit board are implemented.

Embodiment 2

The following describes a semiconductor chip and a semiconductor device according to Embodiment 2 of the present invention.

(a) in FIG. 5 is a sectional view which shows a semiconductor chip 30 according to Embodiment 2 of the present invention. (b) in FIG. 5 is a diagram which shows the semiconductor chip 30 that is flip-chip mounted on a mounting circuit board 42; that is, a sectional view which shows a semiconductor device 40 according to Embodiment 2 of the present invention. It is to be noted that, a bump 41 which is used for flip-chip mounting is illustrated for convenience in addition to the semiconductor chip 30 in (a) in FIG. 5.

The semiconductor chip 30 shown in (a) in FIG. 5 is a Si-MMIC that is to be flip-chip mounted on the mounting circuit board 42 via the bump 41 in a state flipped upside down as shown in (b) in FIG. 5. The semiconductor chip 30 includes: a Si substrate 31; an integrated circuit 32 manufactured on the main surface of the silicon substrate; a conductor film 37b that is a first conductor film for grounding and is formed above the integrated circuit 32; a dielectric film 36 formed above the conductor film 37b; a signal line 38 which is formed in the dielectric film 36 and transmits a signal from the integrated circuit 32; and a conductor film 37a that is a second conductor film for grounding and is formed on the upper surface of the dielectric film 36. The signal line 38, the dielectric film 36, the conductor film 37a, and the conductor film 37b constitute a so-called strip line The Si substrate 31 is a substrate including a Si semiconductor. The Si substrate 31 is, unlike the Si substrate 11 according to Embodiment 1, not restricted by a resistivity, owing to the configuration characteristics shown in (a) and (b) in FIG. 5.

The integrated circuit 32 includes: the circuit layer 34 including a circuit element such as a transistor or the like, and formed on an upper surface of the Si substrate 31; the wiring layer 33 including a signal line of Al, Cu, or the like, which transmits signals from the circuit layer 34; and a passivation film 35 formed on an upper surface of the wiring layer 33. The wiring layer 33 is a multilayer wiring layer in which a signal line is formed on each of the multiple layers via an insulating film such as $SiO_2$, SiN, or the like.

It is to be noted that the diagram shows the circuit layer 34 as a single circuit layer in the integrated circuit 32; however, the circuit layer is not limited to a single circuit layer in the present invention, and the circuit layer may be multilayer according to the present invention.

The conductor film 37b is a film which is formed of Al, Cu, Au, or the like, or an alloy including the Al, Cu, Au, or the like, and which corresponds to one of two GND planes that constitute the strip line (lower plane).

The dielectric film 36 corresponds to a dielectric body that constitutes the strip line, is a polymeric film which has less dielectric loss and which can be formed into a thick film, and preferably is: a film that includes, for example, BCB, polyimide, polytetrafluoroethylene, or polyphenylene oxide; a nanocomposite film in which particles made of a first material are dispersed into a second material; or the like. It is to be noted that a specific example of the nanocomposite film is the same as that of the dielectric film 16 according to Embodiment 1.

The conductor film 37a is a film which is formed of Al, Cu, Au, or the like, or an alloy or the like including the same, and which corresponds to the other of the two GND planes that constitute the strip line (upper plane). The conductor film 37a is connected to a GND pattern on the mounting circuit board 42 via the bump 41. It is to be noted that the two conductor films 37a and 37b are electrically connected with each other via, for example, a conductor (via) 37c that penetrates through the dielectric film 36, as shown in (b) in FIG. 5. However, the method of connecting the two conductor films 37a and 37b is not limited to the above-described method, and the two conductor films 37a and 37b may be connected using a conductor film that covers a side face of the dielectric film 36 or may be connected using a wire.

The method of manufacturing the semiconductor chip 30 described above includes two main processes. To be more specific, the method includes: a usual silicon chip manufacturing process (so-called Si process) in which the integrated circuit 32 is formed on the Si substrate 31; and a rewiring process (so-called post process) in which the conductor film 37b, the dielectric film 36, the signal line 38, and the conductor film 37a are formed after the Si process. It is to be noted that the wiring layer 33 is referred also to as an inner wiring layer because the wiring layer 33 is formed in the Si process.

In the semiconductor chip 30 according to the present embodiment, since the strip line is formed in the rewiring process, the configuration can be applied to manufacturing of a variety of MMICs, independent of the processing node of Si.

The semiconductor chip 30 having the above-described configuration according to the present embodiment has a feature in that the signal line 38, the dielectric film 36, and the conductor films 37a and 37b constitute the strip line. Here, "to constitute the strip line" means to have a configuration in which a dielectric body is interposed between the signal line and the conductor film, and more specifically means that a parameter such as the thickness and width of the signal line 38, dielectric constant and the thickness of the dielectric film 36, and the like, which determines a characteristic impedance of the strip line, is determined such that the characteristic impedance of the strip line substantially matches a value required for the transmission line.

In the semiconductor chip 30 according to the present embodiment, the uppermost face is the GND plane (conductor film 37a). The semiconductor chip 30 is vertically inverted to be flip-chip mounted on the mounting circuit board 42, thereby connecting the conductor film 37a that is located on the uppermost face of the semiconductor chip 30 directly to the GND of the mounting circuit board 42 via the small bump 41. This minimizes the inductance in a portion (the bump 41, here) on which the conductor film 37a is connected to the GND and causes the GND plane (the conductor films 37a and 37b, here) that constitutes the strip line to be reliably grounded, thereby avoiding unnecessary oscillation.

It is to be noted that, since the conductor film 37b between the signal line 38 and the Si substrate 31 serves as a electric field shield in the semiconductor chip 30 according to the present embodiment, it is possible, unlike the semiconductor chip 10 according to Embodiment 1, to ignore an invasion of the electromagnetic field into the Si substrate 31, and thus there is no restriction of the substrate resistance on the Si substrate 31. Therefore, it is possible to implement a low-loss transmission line irrespective of the substrate resistance of the Si substrate 31 or the thickness of the inner wiring layer. According to the simulation described above, for example, the line loss in the strip line that satisfies the conditions for setting the characteristic impedance as 50Ω (for example, the thickness of each of the conductor films 37a and 37b is 5 μm, the thickness of the dielectric film 36 is 25 μm, the dielectric constant ∈ is 2.7, tan δ is 0.0001, the thickness of the signal line 38 is 5 μm, and the line width is 9 μm) is a significantly small value (to be specific, 0.24 dB/mm).

It is to be noted that, the configuration of the strip line is not limited to the configuration shown in (a) and (b) in FIG. 5, and may be the configuration shown in (a) and (b) in FIG. 6.

The semiconductor chip 50 shown in (a) in FIG. 6 differs from the semiconductor chip 30 only in the configuration (layer configuration) of the signal line that constitutes the strip line. In the semiconductor chip 50, plural wiring layers 51a and 51b which enable bridge wiring are formed in the dielectric film 36. It is to be noted that, in the post process of the semiconductor chip 50, a multilayer wiring layer including a total of four layers (the conductor film 37a, the wiring layer 51a, the wiring layer 51b, and the conductor film 37b) is formed. In the semiconductor chip 50 described above, the conductor film 37b, the dielectric film 36, the wiring layer 51a, the wiring layer 51b, and the conductor film 37a are formed in the post process after the integrated circuit 32 is formed in the silicon process.

In addition, in the semiconductor chip 60 shown in (b) in FIG. 6, the conductor film 37a on the uppermost face includes, in part of the conductor film, a cutout region 62 obtained by patterning, and the signal line 61 includes a signal line connected to a signal pattern 63 formed in the cutout region 62. The above-described configuration allows bridge wiring in a wiring layer even when the dielectric film 36 includes only a single wiring layer.

In addition, the semiconductor chip 70 shown in (c) in FIG. 6 corresponds to the semiconductor chip 50 shown in (a) in FIG. 6 in which the conductor film 37b is replaced with a GND plane (conductor film 33a) formed in the inner wiring layer (wiring layer 33). In the semiconductor chip 70 described above, the dielectric film 36, the wiring layer 51a, the wiring layer 51b, and the conductor film 37a are formed in the post process after the integrated circuit 32 including the conductor film 33a that is the GND plane is formed in the silicon process. In addition, it is desirable the GND plane formed in the inner wiring layer is thick as much as possible in order to reduce the conductor loss. Thus, a wiring layer under the uppermost layer wire may be used as the GND plane in addition to the uppermost layer wire, for example. In addition, a conductor film for the pad such as Al, which is used for the pad portion may be stacked and used.

It is to be understood that the wiring layer in the rewiring process is not limited to a single or two layers, and may be three or more layers.

As described above, a GND plane (conductor film) of a microstrip line is formed on the uppermost face in the semiconductor chip according to the present embodiment, and the GND plane of the microstrip line is reliably connected to the GND, by flipping the semiconductor chip and connecting, via a bump, the GND plane to the GND of the mounting circuit board; that is, by performing flip-chip mounting. Accordingly, a semiconductor chip such as an MMIC which has: a Si semiconductor as a substrate; and a low-loss transmission line, and can be easily connected to a circuit board on which the semiconductor chip is to be mounted and can ensure a stable GND potential, and a semiconductor device on which the semiconductor chip described above is flip-chip mounted on the circuit board are implemented.

The semiconductor chip and the semiconductor device according to the present invention have been described based on Embodiments 1 and 2, and the modification examples; however, the present invention is not limited to the Embodiments and the modification examples. Other forms in which various modifications apparent to those skilled in the art are applied to the embodiments and the modification examples, or forms structured by combining elements of different embodiments and the modification examples are included within the scope of the present invention.

For example, the conductor film is shown as a uniform conductor according to the embodiments described above; however, the conductor film, in practice, may have a reticulated pattern or arbitrarily include an opening in order to satisfy the restriction of an occupied space ratio for the pattern in the Si process.

In addition, the sectional view of (a) and (b) in FIG. 1 and the sectional view of (a) and (b) in FIG. 5 show the bumps 21 or 41 for grounding the GND plane (conductor films 17 and 37a) that is the uppermost layer in the semiconductor chip according to the present invention; however, the bump provided to the semiconductor device according to the present invention is not limited to such grounding bumps, and a bump 23 for transferring a power supply or a signal may be provided. More specifically, the cutout region of the conductor film 17 may include a bump to be connected to the circuit layer 14.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be used as a flip-chip semiconductor chip and a semiconductor device including such a semiconductor chip which is flip-chip mounted on a mounting circuit board, and in particular as a Si-MMIC for a small communication device such as a mobile telephone, for example.

What is claimed is:

1. A flip-chip semiconductor chip comprising:
a silicon substrate;
an integrated circuit manufactured on a main surface of said silicon substrate;
a dielectric film formed above said integrated circuit; and
a conductor film for grounding formed on an upper surface of said dielectric film,
wherein said integrated circuit includes at least one wiring layer including a signal line which transmits a signal for said integrated circuit, and said signal line, said dielectric film, and said conductor film constitute a microstrip line.

2. The semiconductor chip according to claim 1, wherein said integrated circuit includes stacked wiring layers including said at least one wiring layer, and said signal line constituting said microstrip line includes a signal line included in an uppermost wiring layer among said wiring layers.

3. The semiconductor chip according to claim 1, wherein said wiring layer includes a conductor film for an electrode pad that is connected to said integrated circuit, and said signal line constituting said microstrip line includes said conductor film for said electrode pad.

4. The semiconductor chip according to claim 1, wherein said dielectric film includes benzocyclobutene, polyimide, polytetrafluoroethylene, or polyphenylene oxide.

5. The semiconductor chip according to claim 1, wherein said dielectric film includes a nanocomposite film in which particles made of a first material are dispersed into a second material.

6. The semiconductor chip according to claim 5, wherein each of said particles has a diameter of between 1 nm and 200 nm, inclusive.

7. The semiconductor chip according to claim 6, wherein said first material is ceramics.

8. The semiconductor chip according to claim 7, wherein the ceramics include strontium titanate; barium strontium titanate; hafnium oxide; hafnium aluminate; or lead zirconate titanate.

9. The semiconductor chip according to claim 1, wherein said silicon substrate has a resistivity of 10 Ωcm or larger.

10. A semiconductor device comprising:
said semiconductor chip according to claim 1, and
a mounting circuit board connected, via a bump, to said conductor film of said semiconductor chip according to claim 1.

* * * * *